United States Patent [19]
Brewer et al.

[11] Patent Number: 5,401,613
[45] Date of Patent: Mar. 28, 1995

[54] METHOD OF MANUFACTURING MICROELECTRONIC DEVICES HAVING MULTIFUNCTIONAL PHOTOLITHOGRAPHIC LAYERS

[75] Inventors: Terry Brewer; James Lamb, III, both of Rolla, Mo.; J. Michael Mori, Boston, Mass.

[73] Assignee: Brewer Science, Rolla, Mo.

[21] Appl. No.: 834,939

[22] Filed: Feb. 12, 1992

Related U.S. Application Data

[63] Continuation-in-part of Ser. No. 626,967, Dec. 13, 1990, Pat. No. 5,110,697.

[51] Int. Cl.⁶ ................................................. G03F 7/11
[52] U.S. Cl. .................... 430/323; 430/271; 430/313; 156/643
[58] Field of Search ............... 430/270, 271, 311, 313, 430/317, 318, 323, 327; 156/643, 659.1, 660

[56] References Cited

U.S. PATENT DOCUMENTS

| | | | |
|---|---|---|---|
| 4,822,718 | 4/1989 | Latham | 430/522 |
| 5,234,990 | 8/1993 | Flaim | 524/609 |

*Primary Examiner*—Kathleen Duda
*Attorney, Agent, or Firm*—Veo Peoples, Jr.

[57] ABSTRACT

A photolithographic composition having improved processability and which eliminates the need for interlayering multiple special purpose coatings in the production of microelectronic devices is surprisingly made possible by selective dissolution of a polymer and an effective light attenuating material in critical solvents. The polymers which are used in the present invention include homopolymers and copolymers of poly(vinylpyridine).

8 Claims, No Drawings

METHOD OF MANUFACTURING MICROELECTRONIC DEVICES HAVING MULTIFUNCTIONAL PHOTOLITHOGRAPHIC LAYERS

This is a continuation-in-part and divisional of application Ser. No. 07/626,967, filed on Dec. 13, 1990, now U.S. Pat. No. 5,110,697.

BACKGROUND OF THE INVENTION

This invention relates to photolithographic compositions employed in the manufacture of microelectronic devices, their method of manufacture, and particularly to methods for applying these compositions as multifunctional thin films onto semiconductor substrates.

In the manufacture of micro electronic devices, photolithographic printing is employed to fabricate circuit pattern images onto semi-conductor substrates. In this process, photosensitive films called photoresist are coated onto the substrate, exposed to light, and then developed in an alkaline developer solution. Upon development, a pattern configuration forms in the photoresist corresponding to a change in solubility of those regions of the photoresist material exposed to the irradiating light. The clarity or resolution of the lines which define these patterns at microns or even sub-micron geometries to a great extent serves as a limitation to the photolithographic process. However, photolithographic technology is approaching its ultimate limit, the point beyond which resolution cannot be improved due to diffraction effects, incompatibility of materials, and complexity of processing.

For example, one of the problems which exists in processes of this type is called reflectivity. This is caused by the fact that some of the light striking a thin layer of photoresist material will usually pass through the layer and be reflected upward from the substrate during the radiation exposure. As the incident light is generally not perfectly normal to the surface of the topography of the substrate, and as it may be diffracted upon passage through the photoresist, the incident light will be reflected angularly from the surface of the substrate rather than normally therefrom. Such light will impinge upon the unexposed portions of the photoresist and some may again pass through the photoresist to strike the opaque portions of, for example, a photo mask, and this light will be reflected back into some portions of the photoresist which are not intended to be exposed. As a result of light being reflected back and forth between the substrate and the photoresist, as well as light being scattered from surface irregularities, there may be a pronounced detrimental effect upon the ultimate resolution which can be obtained upon photo development. These problems are even more pronounced by the standing wave phenomenon and/or the reflective notching phenomenon experienced when patterning or photo developing the material.

Previous attempts to correct the reflectivity problems as disclosed in, for example, U.S. Pat. No. 4,102,683, call for interposing a light absorbing layer between the surface of the substrate and the photoresist material. These so-called anti-reflective layers have the property of absorbing light which passes through the photoresist and not reflecting it back upward. Such a light absorbing layer may be manufactured by mixing a fluorescent dye such as an organic phosphor with an organic binder such as Fluorel made by the 3-M Company or Viton made by DuPont which is a rubber.

Another prior art technique employed to correct reflectivity problems involves the use of a quarter-wave plate having an odd multiple thickness of one-quarter of the wavelength of light to which the photoresist layer is sensitive. This plate is comprised of silicon dioxide thermally grown or deposited in any manner such as by the decomposition of silane. When two light waves of the same amplitude and wavelength arrive at a given point simultaneously and in phase, illumination will occur at that point. If they are out of phase, no illumination will occur because the waves annul each other. By controlling the thickness of the quarter wave plate one can throw reflected light out of phase with incoming light and cancel the reflected light from the substrate.

Other prior art describing similar methods for addressing this reflective phenomenon have been discussed: M. Listvan, et al., in their text "Multiple Layer Techniques in Optical Lithography: Applications to Fine Line MOS Production", published in S.P.I.E., Volume 470, 1984, p. 85, and by R. Coyne, et al., in their article "Resist Processes on Highly Reflective Surfaces Using Anti-Reflective Coatings", published in the proceedings of the Kodak Micro-Electronics Seminar, Interface 1983. Additionally, K. Polasko, et al., discusses this phenomenon in their article "Thin Silicon Films Used as Anti-Reflective Coatings for Metal Coated Substrates", published in S.P.I.E., Volume 631, 1986, p. 181. However, such prior art anti-reflective layers have exhibited a number of problems not the least of which is the fact that in general, when the surface of the substrate is irregular, there is required an additional planarization material or layer. Other disadvantages are, for example, that when prior art organic binders have been patterned by a wet etch development, such layers develop isotropically resulting in undercutting during development which results in a narrow processing latitude or even complete lift-off of sub-micron geometries. Also, certain organic binders such as PMMA and polybutene sulfone when employed as an anti-reflective sub-layer have poor stability as vehicles for etching patterns onto the substrate.

As previously mentioned, when the surface topography of the substrate is irregular, a planarization layer has sometimes been employed which may or may not contain anti-reflective material. Such planarization layers reduce the significance of depth of focus limitations of patterning equipment. In particular, an imaging surface must be flat because the optical patterning equipment can focus only in one plane and will not readily refocus microimages to adjust for nonflatness of a substrate. The depth of focus of an optical printer then becomes a limiting parameter. Since depth of focus is a function of the thickness variation, when using thinner resist or attempting to achieve higher resolution, small thickness variations become more significant and the depth of focus is even more limiting. By planarization consistent thickness and minimal variation can be attained, thereby eliminating the depth of focus problem.

Materials employed as planarization agents are, for example, polymethyl methacrylate (PMMA), polyimides, or phenolformaldehyde condensation resins such as Novolak. These planarization layers, however, in turn require the use of additional layer materials such as adhesion promoters to assist in the layer adhering to the substrate, and for example, interfacial barrier layers between the planarization layer and the photoresist absent a bake prior to overcoating with a photoresist. Such planarization layers have been disclosed in, for example, U.S. Pat. No. 4,370,405, and U.S. Pat. No. 4,524,121.

Interfacial mixing of the photoresist layer, and prior art sub-layer materials, particularly PMMA, is detrimental to the ultimate resolution desired. This stems from the fact that prior art sub-layer polymers cannot withstand overcoating of the photoresist without degrading the film's integrity. Accordingly, interfacial layers have been disclosed comprised of, for example, polyvinyl alcohol polymers, and polyimide precursors. Such interfacial barrier layers have been disclosed in H. Ohtsuka, et al., in their article "PCM Resist Process With RIE Development Method Applied for the Aluminum Etching Process", S.P.I.E., Volume 631, p. 337, 1986; and disclosed in C. Ting, et al., in their article "An Improved Deep Ultra-Violet Multi-Layer Resist Process for High Resolution Lithography", S.P.I.E., Volume 469, p. 24, 1984.

Additionally, it has been suggested in the prior art to employ a lift-off or release layer which is composed of, for example, thick films in the 1 to 3 micron range made from polysulfone polymers, polyimides specially fabricated, or other extraneous photoresist materials. This layer is applied in multi-layer lithography. After pattern transfer, such release layers can be dissolved or physically expanded in its solvent to cause release of all layers coated above it.

Examples of this technology can be found in U.S. Pat. No. 4,692,205 and U.S. Pat. No. 3,873,361. These lift-off layers are also taught to require the assistance of an adhesion promoter for both the release layer and the top photoresist material, and an oxygen etch barrier layer between the photoresist and the lift-off layer. Even with the release layer such as described in U.S. Pat. No. 4,692,205, at least two hours have been required as a practical matter for the lift-off of the layers in this system.

To improve the line resolution, given this technology, there has also been proposed surface application of a contrast enhancement layer onto the photoresist. These contrast enhancement layers have been disclosed by B. Griffing, et al., "Application of Contrast-Enhanced Lithography to 1:1 Projection Printing", S.P.I.E., Volume 469, p. 94, 1984; K. Patrillo, et al., "CEL Resist Processing for Sub Micron CMO's and Bi-Polar Circuits", S.P.I.E., Volume 920, p. 82, 1988. They disclose that these enhancement layers are photobleachable dyes in an inert resin and absorb the light diffracted from the edge of openings in a photo mask used to pattern the photoresist. The enhancement layer increases contrast, which, in turn, increases sidewall angle and the minimum resolution capable from a particular exposure system.

The adhesion promoters previously mentioned in passing are required to provide the best possible adhesion between the substrate, the photoresist layer, and other layers employed in this technology. When conducting photolithography to manufacture micron and sub-micron patterns, adhesion between the photoresist layer and the substrate must be maximized. The extremely minute area between the photoresist and the substrate and the harsh processing conditions subsequent to the application of the photoresist, render adhesion a critical parameter of the process. However, adhesion promoters are usually silicon based materials applied either by spin coating or vapor application as disclosed in U.S. Pat. No. 3,549,368 and U.S. Pat. No. 3,586,554.

The prior art has taught the application of such adhesion promoting materials in a molecular mono-layer and are limited as to what substrates they will compatibly affect adhesion, varying, for example, as between silicon oxide, silicon itself, or silicon nitride. Effective adhesion by an adhesion promoting layer thicker than 100 angstroms has not been possible.

Although the above-described special layers have provided multi-layer material which solves a number of problems, the industry has been dissuaded from perfecting photolithographic processes at sub-micron levels because of the limitations with regard to these materials and the difficulty in processing these multi-laminates.

For example, not only does multi-laminate application require tedious and precise control of the individual film thicknesses, but moreover, many of the layers, particularly those previously used as anti-reflective layers, planarization layers, release layers, etc., require individual baking prior to the application of other layers which is time consuming and oftentimes requires additional equipment.

Accordingly, a new and improved composition which could be applied as a single multifunctional layer providing anti-reflectivity, adhesion, releasability, contrast enhancement, and yet could inhibit interfacial degradation of the sub-layer integrity without the necessity of thermally baking or curing the composition prior to applying a photoresist material would be a welcomed and unexpected advancement in the art.

SUMMARY OF THE INVENTION

It is a principal object of the present invention to provide a new and improved multifunctional photolithographic composition which negates the need for multiple sub-layers interposed between the photoresist layer and the substrate of micro-electronic devices or components.

It is a further principal object of the present invention to provide a new and improved method for interposing a multifunctional sub-layer between the photoresist layer and substrate of a micro-electronic device without the need for pre-baking the entire multifunctional.

It is a further object of the present invention to provide a new and improved multifunctional layer without the need for planarization, effectively interposed between the photoresist layer and the substrate of a micro-electronic device without the need for an interfacial barrier.

It is a still further object of the present invention to provide a new and improved multifunctional layer interposed between the photoresist and the substrate which is intrinsically releasable without the need for applying a release or lift-off layer.

It is an additional object of the present invention to provide a multifunctional sub-layer between the photoresist layer and the substrate which enhances the contrast of the patterned image by diffusion of the light attenuating component of a multifunctional layer without detrimental interfacing of its base polymer, thereby negating the need for a contrast enhancement layer on the top surface of the photoresist.

It is a final object of the present invention to provide a new and improved photolithographic sub-layer interposed between the photoresist and the substrate which effectively promotes adhesion between the photoresist and substrate at sublayer thicknesses above 200 angstrom without the need for baking the sub-layer.

It is another final object of the present invention to provide a new and improved method for defining photolithographic patterns through a multifunctional layer by dry-etching without the need for an oxygen etch barrier layer.

These objects and others, which will become more readily apparent from the following detailed description, preferred embodiments, and illustrative examples, are fulfilled by a method including the steps of forming a multifunctional sub-layer onto a semiconductor substrate, by applying thereto a composition comprising a selected polymer resin, a light attenuating organic dye with absorbance of from 200 to 1,000 nanometers, and a solvent having a molecular weight of between about 84 and 122, and immediately thereafter applying a photoresist layer from the same apparatus without forming any interfacial degradation of the sub-layer integrity. The polymer resin used in accordance with the present invention is selected from the group consisting of poly(vinylpyridine) and aromatic polysulfone.

DETAILED DESCRIPTION AND PREFERRED EMBODIMENTS

In accordance with the present invention, homopolymers or copolymers of poly(vinylpyridine), either alone or in combination with other resinous materials, are used to form a polymeric composition for use in the process of the present invention.

In the past, poly(vinylpyridine) has been disclosed in, for example, U.S. Pat. Nos. 4,581,318 and 4,677,048 as a binder for compositions of a different type, i.e., photoresist layers sensitive to electrons and deep ultraviolet radiation. Poly(vinylpyridines) when employed in that manner, like other binders for photoresist layers such as the polyimides, phenolformaldehyde compensation products, polystyrene, and PMMA, are coated onto substrates at thicknesses ranging from about 5,000 to about 50,000 angstroms. If dyes are employed at all in such photoresist (and none were used in the above-mentioned patents), the dyes are required to be soluble in base developer solution. It is particularly important to note that the poly(vinylpyridine) binders of the prior art were dissolved in methanol and baked onto the substrate.

Nevertheless, we have discovered that poly(vinylpyridine), unlike other photoresist resinous binders, may be synergistically combined with non-photosensitive dyes, insoluble in basic solutions and inert to the polymer to provide the multifunctional compositions of the present invention.

Such poly(vinylpyridine) compositions may be coated at thicknesses ranging from about 500 to 10,000 angstroms in a layer interposed against a dissimilar photoresist polymer or, for that matter, a like photoresist polymer having different solvent characteristics without interfacial degradation. Moreover, we have discovered that by selective dissolution of poly(vinylpyridines) in solvents having a molecular weight ranging between 84 and about 122 and having a flash point ranging from about 28° C. to about 55° C., poly(vinylpyridine) may be used to form a multifunctional photolithographic sub-layer composition which corrects many deficiencies of the prior art.

In a preferred embodiment of the present invention, the resinous binder is poly-4-vinylpyridine at molecular weights of above about 50,000, preferably 200,000. Such polymers are preferred because of their stronger stability against heat and against attack from aqueous base developers employed to develop the adjacent photoresist.

The poly(vinylpyridines) be advantageously employed in a mixture with or as copolymers of other polymers such as polystyrenes, polyamic acids, polyurethanes, methacrylates, polyvinylcarbazoles or cellulose based polymers. It is preferred that when a mixture with other polymers is used, poly(vinylpyridine) comprise at least 50% of the mixture. The polymeric binder will comprise from about 2% to about 40% by weight of the overall composition, but preferably 2%–10%.

The light attenuating organic materials are employed in an effective amount to absorb, dissipate or modify the wavelength of light used to irradiate or expose the photoresist layer ultimately coated over the sub-layer composition. These materials are organic dyes with strong absorbance at wavelengths used in exposure systems such as 488, 436, 405, 365, 350, 310, 280, 248, 240 and 193 nanometers. The film can be made to absorb a narrow or broadband of wavelengths depending upon the selection of the absorbing material. This allows tuning of the composition for any absorbance needed to cover the full range of photoresist exposure wavelengths.

These light attenuating materials must have the properties of being strong absorbers at the wavelength used to expose the photoresist (i.e. the polymers should exhibit sufficient absorption to alleviate problems associated with reflected light such as problems associated with standing waves), insoluble in aqueous base developer, insoluble or poorly soluble in resist spinning solvent, non-photosensitive and inertly compatible with poly(vinylpyridine). We have discovered that when light attenuating materials meet these properties, they synergistically function with poly(vinylpyridine) to increase adhesion to the substrate and photoresist, as well as perform as an anti-reflective coating, release layer and contrast enhancement layer.

To test whether a particular dye is inertly compatible with the polymer, the solution must be allowed to stand at room temperature for six months with a periodic check of coating properties. Properties evaluated include thickness of spun-coated film, viscosity of mixture, particulate residues in film, uniformity of film and absorbance of the film. All these properties should remain identical for the material during the periodic test as to values generated on the original sample. We have found the following dyes to meet all of the above criteria:

6'Butoxy-2,6-diamino-3,3'-Axo dipyridine
Bismarck Brown R Base
Bixin (Color Index #75120)
Calcofluor White RWP (Color Index Fluorescent Brightener #61)
Calcozine Yellow FW (Color Index #41001)
Carbanalide (1,3 diphenalurea)(CAS #102078)
Ceres Yellow GRN (Color Index #21230)
Chrysiodine Yellow Base A (CAS #459-54-5 solvent orange 3)
Hematoporphyrin IX Dimethyl Ester (proprietary available from: Porphyrin Products, Inc., Logan, Utah)
Oil Yellow E-190 (Color Index #11021)
Reakt Yellow 186 (proprietary available from: BASF Wyandotte Corporation, Holland, Mich.)
Rhodamine B (Color Index #45170)
Savinyl Yellow 5GLS (Solvent Yellow 138)

Waxoline Yellow RP FW (Color Index #11855)

A particularly preferred embodiment for the light attenuating organic material for use with poly(vinylpyridine) comprises a mixture of from 20% to 65% Calcozine Yellow FW (Color Index #41001), 5% to 30% Chrysiodine Yellow Base A (solvent orange 3), 3% to 20% Waxoline Yellow RP FW (Color Index #11855), and 0.5% to 5% Rhodamine B (Color Index #45170) by weight of the total light attenuating organic mixture. In addition, another particularly preferred embodiment for the light attenuating organic material for use with aromatic polysulfone comprises a mixture of 2-50% carbanalide and 2-50% reakt yellow 186.

Generally, the light attenuating material or mixture may range in amount in a weight to weight ratio of dye to poly(vinylpyridine) polymer of from 1.0:15 to 1.3:1.

We have surprisingly found that the more standard solvents for poly(vinylpyridine) such as methanol do not perform effectively in the compositions of the present invention, because they may not permit a sufficiently uniform coating onto the substrate or may form latent residuals which contaminate the film even after spin-coating. Particular solvent and solvent mixtures having molecular weights between about 84 and about 122 and flash points of between about 28° C. and 55° C. will effectively produce the poly(vinylpyridine) photolithographic composition that can be used in accordance with the process of the present invention to form a sub-layer without forming any interfacial degradation of the integrity of such sublayer. It is particularly preferred in the poly(vinylpyridine) compositions of the present invention to employ 1-methoxy-2-propanol, cyclopentanone, cyclohexanone, and/or ethyl lactate, either alone or in combination with one another.

Additional components may be employed, if desired, to supplement the invention without detracting from its multifunctional capability. For example, various nitrogen compounds including, for example, 4-nitrobenzaldehyde, 2,4-dinitroaniline, and the like, may be employed to increase oxygen plasma etch rate. Additionally, if desired, cross-linking agents such as Cyracure UVR resins (available from Union Carbide Company) and Isocyanatoethyl Methacrylate (from Dow Chemical Company) may be employed.

Finally, in determining which organic dye/polymer resin composition to use with a particular photoresist, the absorbance of the dye and the indices of refraction for the resin and photoresist should be considered. It is particularly desirable that the absorbance of the organic dye and the index of refraction of the selected polymer resin match the index of the refraction of the photoresist. By matching the index of refraction, one can eliminate surface reflections from the surface of the ARC.

In the process of the present invention, the composition may be coated onto a wide variety of micro-electronic substrates, effectively adhering thereto, while also surprisingly offering releasability or lift-off. Such substrates are, for example, silicon wafers, glass plates, gallium arsenide wafers, quartz plates, silicon oxide film, polysilicon films, aluminum films, tungsten films, chrome films, indium tin oxide films, or the like, used to make micro-electronic devices such as dram and sram memories, micro-processors, CMOS, NMOS, and a bi-polar device. Furthermore, such compositions may also be use to make data storage devices, such as laser discs and the like.

The compositions of the present invention may be coated onto substrates by spin coating, spray coating, and the like, at film thicknesses ranging from about 200 angstroms to 11 microns or higher. The films exhibit excellent adhesion. Furthermore, they instantly set onto substrates so as to permit immediate subsequent coating of a photoresist material with the same coating apparatus. The subsequent coating is considered immediate if it is done without other treatment following application of the compositions of the present invention including further processing such as application of heat for solvent removal, and not allowing an interval of time to elapse to facilitate drying of those compositions. Such photoresist may be comprised of any number of polymeric binders and their attendant solvents without incurring interfacial degradation of the polymeric binder of the composition of this invention by way of spin removal or diffused polymeric admixture. Such photoresist polymers may be any convention photoresist regardless of whether it is positive or negative working, so long as basic developer solution is employed. It is particularly preferred to spin coat the photoresist material onto the sub-layer composition of the present invention in the same spin coater. Subsequently, the photoresist layer may be cured using standard resist cure conditions recommended by the manufacturer.

Thereafter, the photoresist is exposed to irradiation directed in a particular configuration or pattern. Those areas of the photoresist which are exposed, undergo conversion of their solubility relative to aqueous base solutions. That is, they either become soluble, if initially insoluble, or the reverse.

A post-exposure bake of between about 85° C. and 120° C. may be desirable in some poly(vinylpyridine) applications to promote contrast enhancement. This, surprisingly, serves to diffuse the light attenuating organic dyes from the poly(vinylpyridine) composition itself into the photoresist layer even though the poly(vinylpyridine) polymer does not interfacially diffuse into the photoresist. The extent of the contrast enhancement can be controlled by the dye to polymer ratio of the present composition and by time and temperature of the post-bake operation. For example, a dye to polymer ratio of 1.0:1.0 requires a post-exposure bake from 85° C. to 120° C. for approximately 60 seconds. This effect on contrast enhancement can be enhanced or reduced by time of exposure, i.e. it enhanced with more time and reduced with less time. The diffusion of the dye material during this contrast enhancement step, although not entirely understood, is believed to render partially exposed photoresist material insoluble in the aqueous developer while only slightly affecting solubility of the more intensely exposed regions.

The photoresist is then developed in aqueous alkaline developing solution. Then the composite material is thereafter etched. Any standard photolithographic etching technology may be employed. Examples of viable etching processes include oxygen reactive ion etching, sputter etching, or etching techniques involving fluorine and chlorine chemistry.

At this point, the sub-layer itself, can be acted upon by ion implantation or subsequent etch of the substrate material to transfer the pattern image into the substrate. Unlike the prior art, there is no requirement for an oxygen etch barrier layer between the resist and the anti-reflective layer.

It is especially advantageous that the releasability of the composition of the present invention is accomplished within as little as fifteen to twenty minutes as opposed to the exceedingly long (for example, two hours) lift-off requirements of the prior art. The release or lift-off comparison is the same whether by solvent removal or stripping.

Although it was previously reported that poly(vinylpyridines) were thermally stable, it was not known whether thin films composed of such resins when loaded with dyes would remain stable and homogenous when processed as a sub-layer between a photoresist layer and a micro-electronic substrate during, for example, post-bake operations nor during the irradiation exposure step. However, we have found the present invention to achieve this measure of stability.

The following examples are intended to illustrate the invention.

EXAMPLE 1

Preferred Formulation and Application Testing

A multifunctional sub-layer was formed as follows. A photolithographic coating composition was formed by combining the following:

| | |
|---|---|
| 2.3% | Poly(4-vinylpyridine) |
| 1.6% | Calcozine Yellow FW |
| 0.5% | Chrysiodine Yellow Base A |
| 0.5% | Waxoline Yellow RP Fw |
| 0.1% | Rhodamine B |
| 57.0% | 1-Methoxy-2-Propanol |
| 38.0% | Cyclopentanone |

A reddish-yellow coating was prepared by stirring the mixture for several hours. The mixture was then filtered to remove undissolved material. This coating may be used to replace adhesion promoters, planarization layers, anti-reflective coatings, absorbing layers, interfacial mixing barriers, release layers, contrast enhancement layers or any combination thereof with a single material and process. This material was applied to a substrate using the following steps: (1) disclosed material was coated on substrate spinning at 5000 RPM for 30 seconds; (2) Microposit 1470 resists (available from Shipley, Newton, Mass.) was immediately (i.e. without a bake prior thereto) spin coated at 5000 RPM for 30 seconds; (3) resist was then exposed on a Cobilt CA4QO broadband contact printer with 150 millijoules/square centimeter; (4) the exposed resist was developed with Shipley Microposit MF312 developer diluted with deionized water 1:1 for 15 seconds at 20° C.; (5) the disclosed material was etched in a parallel plate etcher. The oxygen etch was conducted at 900 watts power, 400 millitorr vacuum and oxygen flow rate of 150 ml/minute for 3 minutes. This produced resist structures of 0.5 micron that can be used to transfer patterns to aluminum, polysilicon, oxides and the like to make microelectronic devices.

A quartz slide was coated with the disclosed material as described above. Absorbance was measured from 240–500nm wavelengths. This slide was then coated with resist as stated above and cured at 110° C. for 60 seconds on a hot plate. The slide was then blanket exposed to completely photo bleach the resist at 436 nm. Absorbance was then measured again and the difference between the absorbance before and after resist application was determined. This gave a measure of interfacial mixing. This formula gave a coating 1000Å thick with absorbance as follows:

| Wavelength (nm) | Absorbance |
|---|---|
| 436 | .536 |
| 405 | .378 |
| 365 | .238 |
| 248 | .439 |

No significant change was detected in the interfacial mixing test following resist application and exposure.

EXAMPLE 2

Formulation Using Different Absorbing Material

A photolithographic coating composition was formed by combining the following:

| | |
|---|---|
| 2.3% | Poly(4-vinylpyridine) |
| 1.5% | Calcozine Yellow FW |
| 0.5% | Chrysiodine Yellow Base A |
| 0.3% | Reakt Yellow 186 |
| 0.3% | Savinyl Yellow 5GLS |
| 0.1% | Rhodamine B |
| 57.0% | 1-Methoxy-2-Propanol |
| 38.0% | Cyclopentanone |

A reddish-yellow solution was prepared and patterned as described for Example 1 except that glass slides were used in the absorbance measurement for wavelengths from 360 to 500 nm. The film coated to 1200Å thick with the following absorbencies. No interfacial mixing detected.

| Wavelength (nm) | Absorbance |
|---|---|
| 436 | .593 |
| 405 | .341 |
| 365 | .237 |

EXAMPLE 3

Formulation Using Different Absorbing Material

A photolithographic coating composition was formed by combining the following:

| | |
|---|---|
| 2.3% | Poly(4-vinylpyridine) |
| 1.5% | Calcozine Yellow FW |
| 0.5% | 6'-Butoxy-2,6-Diamino-3,3-Azodipyridene |
| 0.3% | Reakt Yellow 186 |
| 0.3% | Savinyl Yellow 5GLS |
| 0.1% | Rhodamine B |
| 57.0% | 1-Methoxy-2-Propanol |
| 38.0% | Cyclopentanone |

A reddish-yellow solution was prepared and patterned, as described for Example 2. The coating resulted in film thickness of 1100Å with no interfacial mixing and the following absorbance properties:

| Wavelength (nm) | Absorbance |
|---|---|
| 436 | .619 |
| 405 | .416 |
| 365 | .261 |

EXAMPLE 4

Formulation Using Different Absorbing Material and Solvent System

A photolithographic coating composition was formed by combining the following:

| | |
|---|---|
| 5.25% | Poly(4-vinylpyridine) |
| 2.63% | Calcozine Yellow FW |
| 2.63% | Chrysiodine Yellow Base A |
| 89.49% | 1-Methoxy-2-Propanol |

A reddish-yellow solution was prepared and patterned, as described for Example 2. The coating resulted in a film thickness of 3000Å with no interfacial mixing and the following absorbance properties:

| Wavelength (nm) | Absorbance |
|---|---|
| 436 | 1.579 |
| 405 | 1.172 |
| 365 | 1.035 |

EXAMPLE 5

Formulation Using Mixed Polymer System

A photolithographic coating composition was formed by combining the following:

| | |
|---|---|
| 2.3% | Poly(1-butene-co-sulfurdioxide) (PBS) |
| 2.3% | Poly(4-vinylpyridine) |
| 2.3% | Flexo Yellow 105 LD |
| 2.3% | Chrysiodine Yellow Base A |
| 42.8% | Cyclohexanone |
| 48.0% | 1-Methoxy-2-Propanol |

A yellow solution was prepared by stirring the mixture for several hours. The mixture was then filtered to remove any undissolved material. PBS was used to increase the rate of etch in plasma etching. Other properties are discussed in Example 2. Etch rate ratios were determined by etching the film in the oxygen plasma etcher as described in Example 1 except that the etch interval was done in three steps with thickness remaining after etching determined for each step. A plot of the amount of material etched versus time provided the etch rate which was then divided by the resist etch rate to give the etch rate ratio. This formulation achieved an etch rate ratio of 1:3 versus the material in Example 4 which had an etch rate ratio of approximately 1:1. This film gave a 3300Å coating thickness which demonstrate interfacial mixing problems with resist and had absorbance properties as follows:

| Wavelength (nm) | Absorbance |
|---|---|
| 436 | 1.724 |
| 405 | 1.368 |
| 365 | 1.180 |

EXAMPLE 6

Formulation Using Additive to Increase Oxygen Plasma Etch Rate

A photolithographic coating composition was formed by combining the following:

| | |
|---|---|
| 4.5% | Poly(4-vinylpyridine) |
| 2.7% | Flexo Yellow 105 LD |
| 1.8% | Iosol Yellow |
| 0.7% | 2,4-Dinitroaniline |
| 90.3% | 1-Methoxy-2-Propanol |

A yellow solution was prepared by stirring the mixture for several hours. The mixture was then filtered to remove any undissolved material. 2,4-Dinitroaniline was used to increase the rate of etch in plasma etching. Etch rate ratios were determined as in Example 6. Results indicate that etch rate ratio of disclosed layer to resist was 1:2. This film gave a 3000Å coating thickness which demonstrated no interfacial mixing problems with resist and had absorbance properties as follows:

| Wavelength (nm) | Absorbance |
|---|---|
| 436 | 1.352 |
| 405 | 0.804 |
| 365 | 0.987 |

EXAMPLE 7

Formulation Using Additive to Decrease Resist Intermixing and Aqueous Base Developer Solubility A photolithographic coating composition was formed by combining the following:

| | |
|---|---|
| 1.8% | Poly(4-vinylpyridine) |
| varied | Cyracure UVR6100 levels |
| 0.2% | Chrysiodine Yellow Base A |
| 2.1% | Calcozine Yellow FW |
| 95.4% | 1-Methoxy-2-Propanol |

A yellow solution of each level of Cyracure UVR6100 was prepared by stirring the mixture for several hours. The mixture was then filtered to remove any undissolved material. Cyracure UVR6100 was used to increase the coating resistance to aqueous base developers and to decrease interfacial mixing of the coating with photoresist. Levels of Cyracure UVR6100 were 0%, 10%, and 15% of polymer solids. The amount of development was 190Å,100Å, and 50Å, respectively, while no interfacial mixing was detected for any of the samples. Process was performed on silicon wafers as in Example 1 through the development step.

EXAMPLE 8

Manufacture of Polysilicon Structures

Using the material from Example 4, the material was spin coated at 5000 RPM for 30 seconds on 5-inch substrates with polysilicon steps, Shipley 1400-27 resist was spin coated at 5000 RPM for 25 seconds, resist cured at 110° C. for 55 seconds. Wafers were then exposed for 800 milliseconds on a Cannon G-line stepper, the resist was spray developed with Shipley 320 developer for 45 seconds at 22° C. the disclosed material was then reactive ion etched in oxygen/argon plasma for 10 seconds, then the polysilicon reactive ion etch was conducted to transfer the pattern to polysilicon and the remaining resist and disclosed material were removed by oxygen plasma etching. The final results showed good line width control over stepped topography for 0.8 micron polysilicon structures.

EXAMPLE 9

Contrast Enhancement Effects of Disclosed Material

Using the material from Example 4, and processed as discussed in Example 8 except that 4-inch aluminum substrates were used and the exposure dose was increased to 1000 milliseconds. The process was run also for Brewer Science's commercially available organic anti-reflective coating with the exposure dose optimized for each process. The anti-reflective coating process required an exposure dose of 300 milliseconds. Following development, submicron structures were inspected for both systems. The particular structures of interest were a group of square posts of varying sizes with equally sized spaces from 1.2 microns to 0.4 microns. These structures were intact to 0.4 microns but showed resist scumming between the structures at 0.45 microns for the disclosed material. The remarkable observation about these structures was that they remained square with vertical sidewall angles down to 0.45 microns, well below the minimum resolution capabilities of the exposure equipment used. Though the wet developable anti-reflective coating showed these structures intact to 0.7 microns, the structures were rounded due to the resolution capabilities of the exposure system. Line space pairs were intact down to 0.55 microns though the square posts were totally missing at that point for wet developable absorbing coatings. Both coatings below the resist stopped reflective problems. However, only the disclosed material had a significant impact on the resist contrast, extending the resolution below that for which the tool was designed.

EXAMPLE 10

Comparative Example of the Adhesion Functionality

The material of Example 4 was applied to 3-inch aluminum, silicon nitride, silicon and silicon oxide as described in Example 1. Samples of each substrate were also prepared with HMDS adhesion promoter. The adhesion promoter received a 130° C., 30 second hot plate bake. Resist was coated on all substrates and exposed as described in Experiment 1. The patterned films were then developed in 1:1 MF312 developer diluted with deionized water. The development was conducted at 21° C. for 20, 40, 80 and 160 second develop time. Standard develop times for this system are 15 to 20 seconds. The over-development was used to stress the adhesion of the geometries patterned onto the substrate. There are three structures evaluated and given a ranking to determine adhesion. These structures are daggers (D) a series of decreasing sizes of posts (P) and a series of decreasing sizes of isolated lines called a comb (C) structure. To normalize the data the following equation is used.

SCORE=P+3C-4D

Each structure is evaluated for the smallest structures remaining intact after exposure to the developer. The higher score represents better adhesion. The results are as follows:

| SYSTEM | SUBSTRATE | SECONDS OF DEVELOPMENT | | | |
|---|---|---|---|---|---|
| | | 20 | 40 | 80 | 160 |
| | | SCORE | | | |
| HMDS | ALUMINUM | 31 | 31 | 30 | 21 |
| | NITRIDE | 36 | 36 | 34 | 34 |
| | SILICON | 37 | 36 | 38 | 37 |
| | OXIDE | 31 | 29 | 26 | 27 |
| DISCLOSED | ALUMINUM | 47 | 47 | 47 | 47 |
| MATERIAL | NITRIDE | 47 | 47 | 47 | 47 |
| | SILICON | 47 | 47 | 47 | 47 |
| | OXIDE | 47 | 46 | 46 | 47 |

EXAMPLE 11

Comparative Evaluation of Other Polymer Systems

Many polymer systems were evaluated including those mentioned in the prior art by Brewer Science Pat. Appl. Ser. No. 431,798 such as PMMA and PBS. In this test polymers and dye systems were prepared where the dyes consisted of those found in the material of Experiment 4. Where possible the solvents used in Experiment 4 were used as well. All the materials were evaluated for coat quality after a 5000 RPM spin for 30 seconds without a bake process. The films that had good coats were further evaluated to determine if they had interfacial mixing with the resist. This test was conducted as specified in Example 2.

| POLYMER | COAT QUALITY | INTERFACIAL MIXING |
|---|---|---|
| ETHYL CELLULOSE | Good Coat | Complete Dissolution |
| PMMA | Good Coat | 80% Stripping |
| POLYSTYRENESULFONE | Good Coat | 85% Stripping |
| POLY-2-VINYL PYRIDINE | Good Coat | 13% Stripping |
| POLY-4-VINYL PYRIDINE | Good Coat | <5% Stripping |
| POLYCARBONATE | Good Coat | 81% Stripping |
| PBS | Good Coat | 85% Stripping |

The poly(vinylpyridine)s are the only candidates that show significant resistance to photoresist solvent attack even though most of the systems tested are reported to be insoluble in photoresist solvents such as cellosolve acetate.

EXAMPLE 12

Comparative Evaluation of Release Properties

This example is designed to test the functionality of the disclosed material as a release layer against the functionality of prior art materials such as polyimides and positive two component photoresist such as Shipley Microposit 1470 resist as indicated in U.S. Pat. Nos. 4,692,205 and 3,873,361. In this test for resist and polyimide sub-layers the 3-inch silicon substrates were first coated with an adhesion promoter and baked at 110° C. for 30 seconds on a hot plate. Two substrates were then coated with polyimide by spinning at 5000 RPM for 60 seconds followed by a beta stage bake of 135° C. in a convection oven for 30 minutes. Two substrates not coated with adhesion promoter were coated with the disclosed material as described in Example 1. Both the wafers coated with polyimide and those coated with the disclosed material were coated with resist as described in Example 1. Two silicon substrates with adhesion promoter were also coated with resist. The resist and the resist polyimide substrates were patterned with aqueous based developer. The substrates with the disclosed material was patterned by oxygen plasma etching. One of each type of film processed was exposed to 200° C. for 30 minutes while the remaining substrate from each set were exposed to 250° C. temperature for 30 minutes. All the substrates were then allowed to soak in 99-AL photoresist stripper at 60° C. The stripper is available from Mallinckrodt (St. Louis, Mo.). After 17 minutes both wafers with the disclosed material as a base layer were completely clean. Both other substrate types showed no evidence of resist removal at up to one hour; at that point the test was discontinued.

We claim:

1. A microlithographic process which uses a dye loaded binder for a multifunctional layer that requires no baking where the photoresist layer can be immediately applied to the said multifunctional layer comprising:
   a. preparing a multifunctional composition by dissolving a polymer and a light attenuating material in a selected solvent system, wherein said polymer is selected from the group consisting of homopolymers of poly(vinylpyridine) and copolymers of poly(vinylpyridine) with ethylenically unsaturated comonomers selected from the group consisting of styrene and alkyl methacrylates alkyl(meth)acrylates, said light attenuating material is an organic dye with an absorbance at the wavelength used to expose the photoresist, typical exposure wavelengths are between 200 to 1,000 nanometers and said light attenuating material is inertly compatible with said polymer, and said solvent system consists of a solvent or mixture of solvents, with the individual solvents having a molecular weight of between about 84 and 122 and flash points of between about 28° C. and 55° C.;
   b. forming a multifunctional layer by applying said multifunctional composition onto a substrate;
   c. immediately thereafter forming a photoresist layer by applying a photoresist composition onto said multifunctional layer without prior processing to dry said multifunctional layer;
   d. imaging said photoresist layer by selectively exposing to light segments of said photoresist layer corresponding to a predetermined pattern, wherein said light is at a wavelength wherein said light attenuating material is a strong light absorber;
   e. developing the photoresist layer to form a pattern.

2. The microlithographic process of claim 1 wherein said multifunctional layer serves as an anti-reflective coating.

3. The microlithographic process of claim 1 wherein said polymer is a homopolymer or copolymer of poly(-vinylpyridine) and said solvent system is selected from the group consisting of 1-methoxy-2-propanol, cyclopentanone, cyclohexanone and ethyl lactate, and mixtures thereof.

4. The microlithographic process of claim 1 wherein said is multifunctional formed by spin-coating said multifunctional composition onto said substrate at a film thickness of from about 500 to about 10,000 angstroms.

5. The microlithographic process of claim 1 wherein after exposure to light said photoresist is baked at from 85° C. to 120° C. diffusing the light attenuating material into the photoresist layer.

6. The improved microlithographic process of claim 1 wherein the absorbance band of light attenuating material matches the exposure band used to expose the photoresist and the index of refraction of the multifunctional layer matches the index of refraction of the photoresist layer at the exposure band used to expose said photoresist.

7. The improved microlithographic process of claim 1 including an additional step comprising removing the etched multifunctional layer and photoresist layer from the substrate in less than about 20 minutes leaving the etched substrate.

8. A microlithographic process which uses a dye loaded binder for a multifunctional layer that requires no baking where the photoresist layer can be immediately applied to the said multifunctional layer comprising:
   a. preparing a multifunctional composition by dissolving a polymer and a light attenuating material in a selected solvent system; wherein said polymer is selected from the group consisting of poly(vinylpyridine) and copolymers of poly(vinylpyridine) with ethylenically unsaturated comonomers selected from the group consisting of styrene and alkyl(meth)acrylates; said light attenuating material is selected from the group consisting of 6'Butoxy-2,6-diamino-3,3'-Axo dipyridine, Bismarck Brown R Base, Bixin, Calcofluor White RWP, Calcozine Yellow FW, 1,3 diphenalurea, Ceres Yellow GRN, Chrysiodine Yellow Base A, Hematoporphyrin IX dimethyl ester, Oil Yellow E-190, Reakt Yellow 186, Rhodamine B, Savinyl Yellow 5GLS and Waxoline Yellow RP FW, and mixtures thereof; and said solvent system consists of a solvent or mixture of solvents, with the individual solvents having a molecular weight of between about 84 and 122 and flash points of between about 28° C. and 55° C.;
   b. forming a multifunctional layer by applying said multifunctional composition onto a substrate;
   c. immediately thereafter forming a photoresist layer by applying a photoresist composition onto said multifunctional layer without prior processing to dry said multifunctional layer;
   d. imaging said photoresist layer by selectively exposing to light segments of said photoresist layer corresponding to a predetermined pattern, wherein said light is at a wavelength wherein said light attenuating material is a strong light absorber;
   e. developing the photoresist layer to form a pattern.

* * * * *